United States Patent [19]

Daughton et al.

[11] Patent Number: 4,731,757

[45] Date of Patent: Mar. 15, 1988

[54] MAGNETORESISTIVE MEMORY INCLUDING THIN FILM STORAGE CELLS HAVING TAPERED ENDS

[75] Inventors: James M. Daughton, Edina; Jack S. T. Huang, Plymouth, both of Minn.

[73] Assignee: Honeywell Inc., Minneapolis, Minn.

[21] Appl. No.: 879,679

[22] Filed: Jun. 27, 1986

[51] Int. Cl.⁴ .............................................. G11C 11/15
[52] U.S. Cl. ..................................... 365/173; 365/158
[58] Field of Search ................... 365/158, 173; 29/604

[56] References Cited

U.S. PATENT DOCUMENTS

| | | | |
|---|---|---|---|
| 3,117,885 | 1/1964 | Pohm et al. | 365/171 |
| 3,218,616 | 11/1965 | Huijer et al. | 365/158 |
| 3,432,832 | 3/1969 | Holtwijk | 365/158 |
| 3,466,636 | 9/1969 | Anacker | 365/55 |
| 3,493,943 | 2/1970 | Raffel | 365/158 |
| 3,531,780 | 9/1970 | Huijer | 365/158 |
| 3,576,552 | 4/1971 | Vinal | 365/173 |
| 3,798,623 | 3/1974 | Kaske et al. | 365/173 |
| 3,883,858 | 5/1975 | Lienhard et al. | 365/158 |
| 3,996,575 | 12/1976 | Battarel | 365/158 |
| 4,208,725 | 6/1980 | Paul et al. | 365/158 |
| 4,356,523 | 10/1982 | Yeh | 365/158 |
| 4,455,626 | 6/1984 | Lutes | 365/158 |

OTHER PUBLICATIONS

IBM Technical Disclosure Bulletin—vol. 8, No. 11, Apr. 1966; pp. 1613-1614.
"Magnetoresistive Readout for 200-Nsec TF Memory," *Electronic Design*, Mar. 15, 1962, p. 31.
"Magnetoresistive Readout of Thin-film Memories," *Digest of Technical Papers*, 1962 International Solid-State Circuits Conference, P. Huijer, pp. 36-37.
"Magnetoresistance in Laminated NiFe films," *Journal of Applied Physics*, vol. 53, No. 3, Mar. 1982, van Ooyen, et al., pp. 2596-2598.
"Magnetoresistive Switching of Small Permalloy Sandwich Structures," *Journal of Applied Physics*, vol. 55, No. 2, Jan. 15, 1984, Berchier, et al., pp. 487-492.

Primary Examiner—James W. Moffitt
Attorney, Agent, or Firm—William T. Udseth

[57] ABSTRACT

A digital memory based on a memory cell having two magnetoresistive ferromagnetic film portions separated by an intermediate layer all of which are gradually narrowed at the ends thereof.

Adjacent memory cells are preferably arranged in a line with conductive junctions therebetween. The magnetic state of each cell can be sensed or set by providing currents of different magnitudes in conductive word lines which overlie the cells. The narrowed ends of the cells reduce demagnetizing effects which occur if the cell ends are abruptly terminated.

14 Claims, 5 Drawing Figures

4,731,757

MAGNETORESISTIVE MEMORY INCLUDING THIN FILM STORAGE CELLS HAVING TAPERED ENDS

Reference is hereby made to an earlier filed copending application by J. M. Daughton and A. V. Pohm entitled "Magnetic Memory" having Ser. No. 870,068. This copending application has been assigned to the same assignee as the present application.

BACKGROUND OF THE INVENTION

The present invention relates to ferromagnetic thin film memories, and more particularly, to ferromagnetic thin film memories in which the memory cell structure is configured to reduce demagnetizing fields.

Digital memories are used extensively in digital systems of many kinds including computers and computer system components, and digital signal processing systems. Such memories can be advantageously based on the storage of digital bits as alternative states of magnetization in magnetic materials in each memory cell, typically thin film materials. These may be ferromagnetic thin film memories which may provide access to information stored therein by either inductive sensing to determine the magnetization state, or by magneto-resistive sensing for such determination. Such ferromagnetic thin film memories may be provided on the surface of a monolithic integrated circuit to provide for convenient electrical interconnections between the memory cell and the memory operating circuitry.

Ferromagnetic thin film memory cells are usually made very small and packed very closely together to achieve significant density of stored bits, particularly when provided on a surface in a monolithic integrated circuit. The magnetic environment can become quite complex with fields in any one memory cell affecting the film portions in neighboring memory cells. Also, small ferromagnetic film portions in a memory cell can lead to substantial demagnetizing fields which can cause instabilities in the magnetization state desired in such a cell.

These magnetic effects between neighbors in an array of closely packed ferromagnetic thin film memory cells can be ameliorated to a considerable extent by providing a memory cell based on an intermediate separating material having two major surfaces on each of which an anisotropic ferromagnetic memory film is provided. Such an arrangement provides a significant "flux closure" to thereby confine the magnetic fields arising in a cell to affecting primarily just that cell. This is considerably enhanced by choosing the separating material and the ferromagnetic memory film to be sufficiently thin.

Often such a digital memory is constructed by having a number of memory cells in series connected at bit structure junctures to one another in an end-to-end fashion. A series of current straps, or word lines, are often provided in an orthogonal layout to a series of connected bit structures so that a strap crosses each of the bit structures between the bit structure junctures. In a magnetoresistive memory, such straps or word lines are used both in the entering of and the sensing of information in the bit structures. This can be done by using currents in the word lines for setting, or for determining the existing, magnetization of bit structures in the memory.

However, with respect to magnetic fields generated by word lines over a bit structure there is no "flux closure." This is because the word line is over the top of the bit structure and so there is no closed magnetic path for magnetic fields in the bit structure around that word line. The result is that very large demagnetizing fields can occur in a bit structure both for entering information and for sensing information in that bit structure. The magnetic field set up by current through the word line will attempt to magnetize each portion of the ferromagnetic memory film on the two major surfaces of the separating material in the same direction. The resulting distribution of "free poles" at the ends of the bit structure then give rise to such demagnetizing fields. Such fields can seriously disrupt the operation of the memory.

SUMMARY OF THE INVENTION

The present invention provides a digital memory having a bit structure in a memory cell based on an intermediate separating material having two major surfaces on each of which an anisotropic ferromagnetic memory film is provided. The memory film, rather than terminating abruptly at bit junctures between memory cells, narrows near such bit junctures from the width occurring in more centralized regions of the bit structure.

DESCRIPTION OF THE PREFERRED EMBODIMENTS

Figure 1:
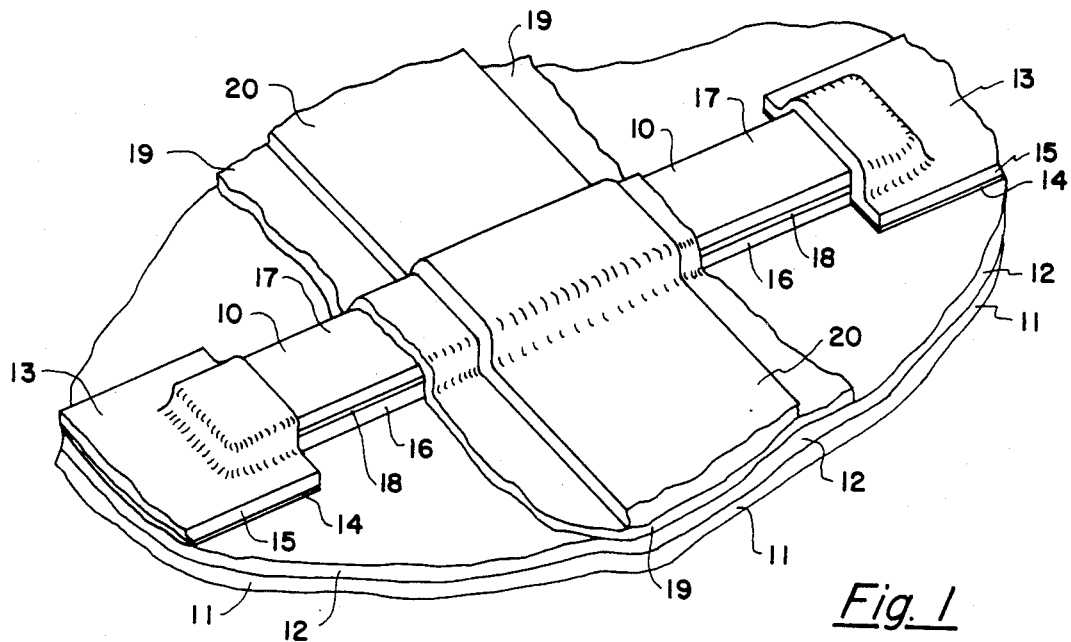
FIG. 1 shows a memory cell having sharply terminated memory films therein.

A metallic thin film useful in making magnetic thin film memories is an alloy of nickel, cobalt and iron. Typically, the proportions are chosen to strongly reduce or eliminate any magnetostrictive effects in the film and to improve certain other properties of the film for the application at hand. As a possible example, the film material might comprise approximately sixty percent (60%) nickel, twenty-five percent (25%) cobalt, and fifteen percent (15%) iron. In some situations other materials are added to the alloy in relatively small amounts to improve selected properties of the film.

Such films can be fabricated by vacuum deposition or by other methods and, when done in the presence of a magnetic field oriented in a selected direction, the resulting magnetic thin film will exhibit uniaxial anisotropy with the easy axis parallel to the magnetic field orientation. Because very large demagnetizing fields would otherwise result, the magnetization vector of such a film will always lie in the plane of the film.

Furthermore, in accord with thermodynamics, the magnetization of such a film will arrange itself to minimize the magnetic energy. In the absence of any externally applied magnetic fields such minimization occurs when the magnetization vector of a film portion parallels the easy axis of the film portion pointing in either direction along such axis. This may not be the case in a situation where more than one domain occurs or where other boundaries arise in the magnetic film leading to bounded regions having magnetizations in various orientations. In such situations, the average magnetization for the film may lie at some angle to the easy axis.

In any event, the situation in such a film portion changes in the presence of externally applied magnetic fields and the minimization of magnetic energy may then occur with the magnetization vector for the film oriented at some angle, with respect to the easy axis, differing from the angle occurring, if any, in the absence of the external field. As long as the magnetization of the film portion is in a single domain state, the magnetization vector then can be caused to rotate with respect to the easy axis to angles determined by the externally applied fields, and this can occur without substantially affecting the magnitude of the magnetization.

In such a state with external magnetic fields applied to the film portion, the total magnetic energy can be approximately determined. The minima of this energy can be calculated as a basis for determining the angle of the magnetization vector with respect to the easy axis, usually as a function of the magnetic field components parallel with and perpendicular to the easy axis.

In addition, the critical values for external magnetic fields can be found which govern transitions of the magnetization vector position from unstable to stable states. The equation for such critical fields is found to be in the form of a hypocycloid, usually termed an astroid, so that external fields of values within the astroid lead to the magnetization being at a stable angle but those of values outside the astroid lead to potential instability. This instability is manifested as a flipping of the magnetization vector from pointing at least to some extent along one direction of the easy axis to pointing at least some extent in the opposite direction. Thus, the magnetization vector can be made to switch from one direction along the easy axis to the opposite which means the magnetization vector can be in one of two different states which provides the basis for storing a binary bit.

Such ferromagnetic thin films as those just described further exhibit magnetoresistance. Differences in direction between that of the magnetization vector in the thin film and that of current passed through the thin film leads to differences in the effective electrical resistance in the direction of the current. The maximum resistance occurs when the magnetization vector in the film and the current direction are parallel, while the minimum occurs which they are perpendicular. Resistance of a magnetoresistive resistor can be shown to be given by a constant value representing the minimum plus an additional value depending on the angle between the current direction of the film and the magnetization vector therein. This additional resistance follows the square of the cosine of that angle.

Thus, external magnetic fields can be used to vary the angle of the magnetization vector in such a film portion with respect to the easy axis of the film, and can vary it to such an extent as to cause switching the magnetization vector between two stable states which occur as magnetizations oriented in opposite directions along the easy axis. Further, the state of the magnetization vector in such a film can be measured or sensed by the change in resistance encountered by a current directed through this film portion. This provides a basis for a film portion to serve as a bit storage means in a memory cell, the state of which is subject to being determined by effects occurring in currents applied to this portion.

However, such operation may not prove achievable if various demagnetizing field effects dominate the magnetic situation. As the memory cell bit structures become more and more compact and located closer and closer to one another to improve the packing density to thereby keep costs low, the interaction of the magnetic fields occurring in one cell upon its neighbors can become quite significant. Such affects are usually deleterious in that such fields will often act to increase the demagnetizing field experienced in the neighboring cells.

As indicated above, this can be minimized to a considerable extent by use of a memory cell based on intermediate separating material having two major surfaces on each of which an anisotropic ferromagnetic memory film is provided. Such a "sandwich structure" can provide a significant amount of "flux closure" to thereby confine the magnetic fields arising in a cell to affecting primarily just that cell especially if the film and separating material thicknesses are chosen sufficiently thin.

However, a further problem, again as indicated above, is the fact that there is no "flux closure" with respect to fields induced by currents through word lines over a memory cell bit structure. To better understand this situation, consider the typical bit structure, 10, shown in FIG. 1 which is formed over a semiconductor material body, 11, as used in a monolithic integrated circuit, and directly on an insulating layer, 12, supported on a major surface of body 11 in the integrated circuit. Only a small portion of the integrated circuit is shown, and then only a small portion of semiconductor material body 11 is shown of that integrated circuit portion. Juncture interconnections, 13, are shown provided over the "sandwich structure" of the magnetic films and the separating material. Juncture interconnections 13 are shown comprising a multiple metal layer arrangement, the first layer, 14, serving as the barrier layer and a second layer, 15, for carrying the bulk of the current. Barrier layer 14 would typically be a 1200 Å thick layer of titanium-tungsten while layer 15 would typically be aluminum alloyed with two percent (2%) copper in the thickness of 5000 Å. Juncture interconnections 13 are also disposed in part on the exposed surface of insulating layer 12.

Disposed on the exposed major surface of insulating layer 12 is bit structure 10 shown comprised of a lower ferromagnetic thin film, 16, and an upper ferromagnetic thin film, 17. Ferromagnetic thin film layers 16 and 17 are each as described above in that they exhibit uniaxial anisotropy, magnetoresistance, little magnetostriction, and are of an alloy composition. In between ferromagnetic thin film layer 16 and 17 is a further thin film layer, 18, which usually would not exhibit ferromagnetism but may be either an electrical conductor or an electrical insulator. Layer 18 must, however, prevent the exchange interaction between electron spins on neighboring atoms from coupling across between layers 16 and 17 to lock together the magnetization vectors in each. A typical choice for layer 18 would be silicon nitride. An insulating layer, 19, covers bit structure 10 although only part of it is shown in FIG. 1.

The "sandwich structure" of FIG. 1 is effective in reducing magnetic fields outside bit structure 10 because the magnetic fields occurring in either of ferromagnetic thin film layers 16 and 17 are, to a considerable extent, confined to the magnetic path provided by the other. Thus, the effect of magnetic fields occurring in either of layers 16 and 17 on neighboring bit structures is much reduced.

A further confinement of magnetic fields occurring in bit structure 10 of FIG. 1 can be achieved by providing magnetic material on the sides of bit structure 10.

Finally, a word line, 20, as shown in FIG. 1 disposed on the major surface of insulating layer 19. Word line 20 is typically comprised of an aluminum layer alloyed with approximately two percent (2%) copper on a titanium-tungsten base layer with a total thickness of 5000 Å. A protective and insulating layer over the entire structure of FIG. 1 would be used in practice but is not shown.

The orthogonality of word line 20 and bit structure 10, the magnetoresistive properties of layers 16 and 17, and the desire to have as large an output signal as possible leads to a choice of providing the easy axis in layers 16 and 17 in one of two principle directions. Bit structure 10 can be operated in a longitudinal mode with the easy axis for layers 16 and 17 directed parallel to bit structure 10 between juncture interconnections 13. Alternatively, the easy axis in layers 16 and 17 can be formed perpendicular to this first choice and parallel to word line 20 leading to operation in the transverse mode. In the following, the assumption will be that the easy axis is in a direction perpendicular to the center line extending between junction interconnections 13 and the whole operation is intended to be in the transverse mode.

The orthogonality of word line 20 and bit structure 10 also means that current through word line 20 will lead to magnetic fields aligned with bit structure 10 along its long axis which intersects the juncture interconnections 13 on each end. While most of such fields occurring below word line 20 will be confined to memory film 16 and 17 of bit structure 10, those above word line 20 will not be. Thus, there will not be "flux closure" for fields created by word line 20. Magnetic films 16 and 17 will each tend to be magnetized by such fields in the same direction along the long axis of the bit structure 10. Complete magnetization along such axis would result in very large opposing demagnetizing fields of perhaps many tens of Oersteds.

This situation, however, is not likely to occur without a significantly larger current in word line 20 than would otherwise be expected because thermodynamic energy minimization considerations. These considerations lead to the expectation of regions with magnetic boundaries being formed in which the magnetization therein is reversed from the direction urged by the fields due to word line 20, or partially reversed, particularly near the ends of bit structure 10 where demagnetizing fields would be most intense. That is, there would be a change in the normal magnetization situation existing before application of a field. In this situation, the magnetization lies along the easy axis parallel to word line 20 except along the long edges of bit structure 10 where the magnetization is parallel to these edges, because of further demagnetization considerations, with some bending of this edge magnetization near the bit structure ends. Subsequently, rather than just some bending in the magnetization near the ends of bit structure 10 upon application of a field by virtue of a current in word line 20, various magnetically bounded regions can be expected to form at least near the ends of bit structure 10, regions in which the magnetization changes drastically to even being reversed from the direction being urged by the field due to current in word line 20 because of induced demagnetizing effects.

The result of any such regions forming is that a significantly greater current is required in word line 20 to cause the magnetization in magnetic layers 16 and 17 of bit structure 10 to be in substantially one direction from the current which are required if such regions did not form. Such a result adds complications in providing a writing system in the digital memory using such bit structures.

A further problem arises in those situations where a smaller current on word line 20 is used in sensing what was intended as the magnetization state in bit structure 10 (magnetization substantially along the easy axis in one or the other alternative directions) through changing magnetization angles sufficiently to permit the magnetoresistive sensing of such state of the magnetization. The existence of regions in which magnetization is reversed can lead to regions where the resistance increases and to other regions where the resistance decreases to thereby reduce the total magnetoresistance effect for bit structure 10 as a whole through cancellation so that sensing becomes difficult or impossible.

Finally, in those situations where such bounded magnetic regions of reversed or partially reversed magnetization form not just near the bit structure ends but also extend into central portions of the bit structure, the magnetization state can become indeterminate. As a result, the information in the memory cell with such a bit structure is lost.

The foregoing demagnetization situation appears to arise in substantial measure because of the abrupt termination of bit structure 10 from a uniform width to suddenly being narrowed to zero width at each end. That is, such an abrupt end leads to a major discontinuity in the orientation of spins along the edges of bit structure 10 in FIG. 1, and leaves much of the effective "free pole" density apparently distributed just across the ends of bit structure 10.

Figure 2:
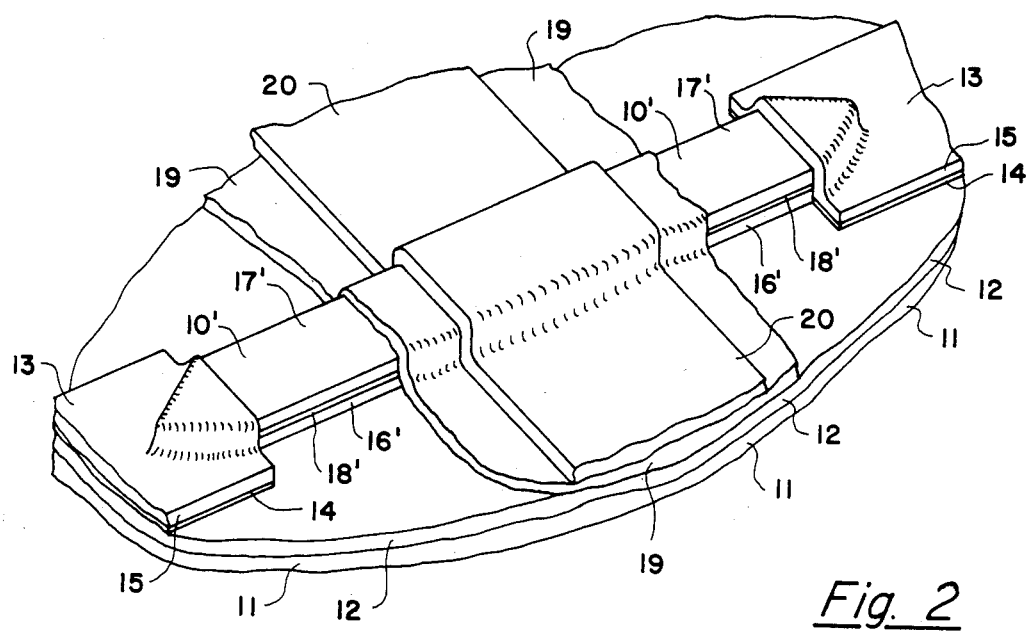
FIG. 2 shows a memory cell having memory film less sharply terminated.

On the other hand, the structure shown in FIG. 2 has the bit structure ends narrowing in width to becoming a point, narrowing from the width of bit structure 10 in more centralized portions thereof under word line 20, i.e. tapering to a point. This configuration, the bit structure end geometry being bounded substantially by two intersecting lines, reduces such abrupt discontinuity to occurring only near the point of the taper, and thereby appearing to leave much of the effective "free pole" density spread out along the tapered portion of the ends since the spins are only gradually reoriented by the narrowing memory film sides. Thus, there would appear to result a much lower concentration of "free poles" at the point.

The designations used on structural features in FIG. 2 is the same as those to which they are similar in FIG. 1. However, because the change occurs in the bit structure, bit structure 10 of FIG. 1 has been redesignated 10' in FIG. 2, magnetic layers 16 and 17 of FIG. 1 have been redesignated as 16' and 17' in FIG. 2, and intermediate layer 18 of FIG. 1 has been redesignated 18' in FIG. 2. All of the structures in FIG. 2, however, are of the same nature as in FIG. 1 with the change being only to the shape of the bit structure ends.

Figure 3:
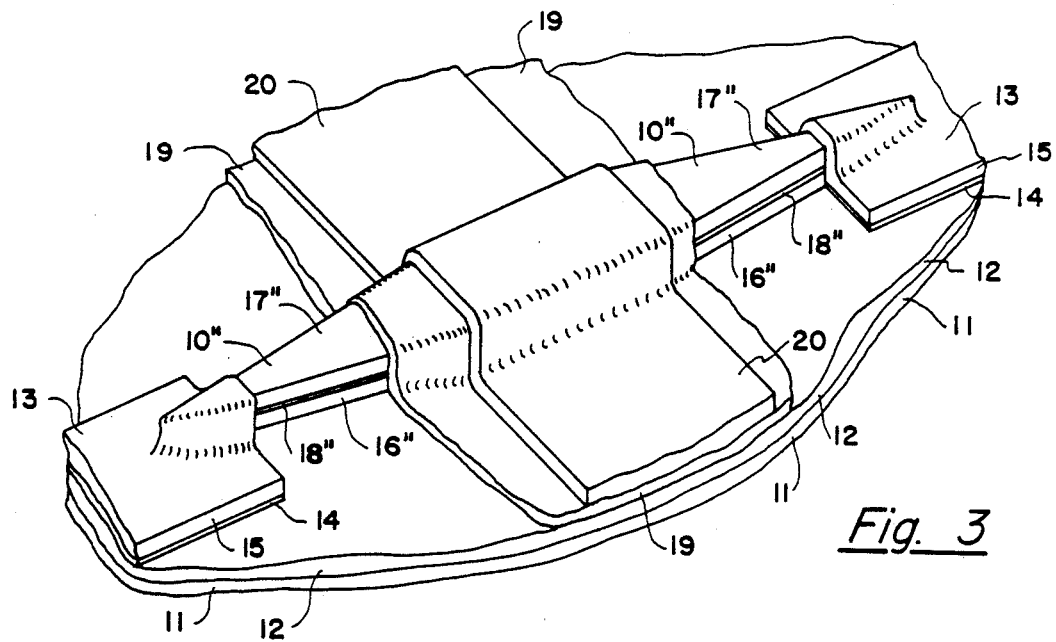
FIG. 3 shows a memory cell having memory film even less sharply terminated.

Similarly, in FIG. 3 the redesignations involve only the bit structure which now is designated with a double prime as are the components thereof so that in FIG. 3 it is bit structure 10", magnetic film layers 16" and 17", and intermediate layer 18". FIG. 3 shows extending the narrowing further back from the end points toward the central portion than was shown in FIG. 2, the narrowing beginning nearly at word line 20 in FIG. 3. Bit structures narrowed beginning from points intermediate to those shown in FIGS. 1 and 2 are also useful.

Figure 4:
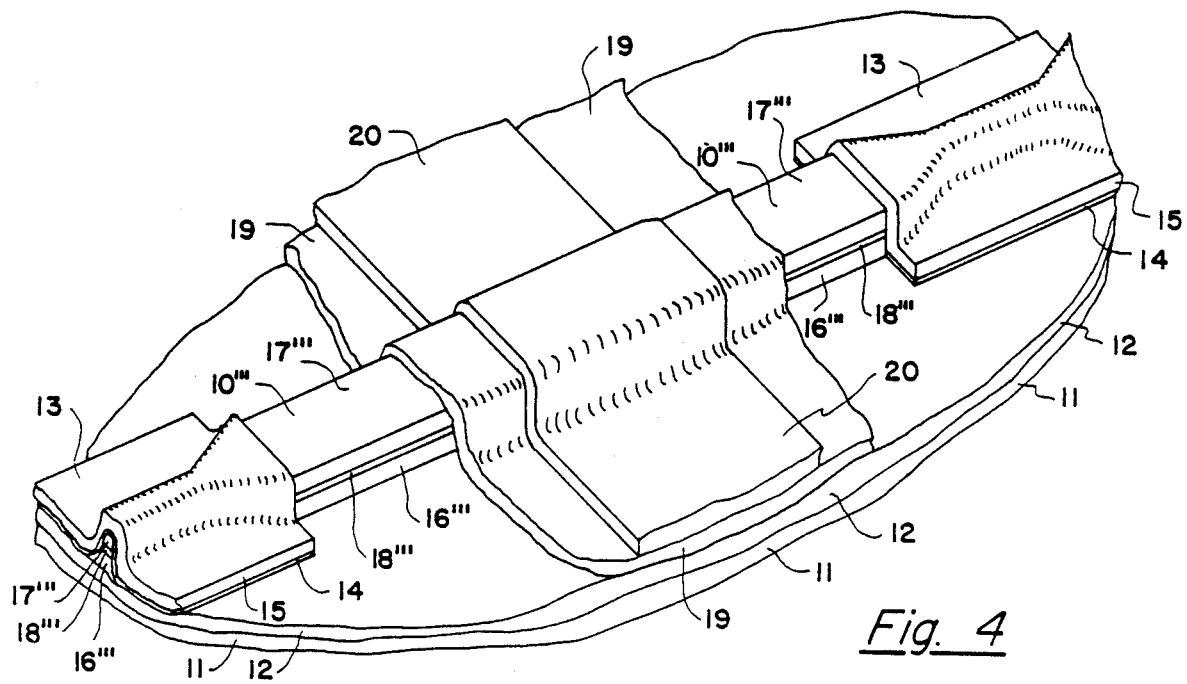
FIG. 4 shows a memory cell having memory film which narrows but does not entirely terminate.

Again in FIG. 4, structures similar to those in FIG. 1 carry the designations used in FIG. 1 but bit structure 10 of FIG. 1 in a new configuration has been redesignated 10''' in FIG. 4. Similarly, its components are now designated 16''' and 17''' for the magnetic film layers, and 18''' for the intermediate layer. Any of the structures in FIGS. 2, 3 and 4 could also have additional magnetic material provided along the sides thereof to more completely provide for "flux closure" around the intermediate layer.

Bit structure 10''' of FIG. 4 differs in eliminating a major discontinuity at the ends thereof in continuing magnetic layer 16''' and 17''' and intermediate layer 18''' right through the bit junctures at bit structure 10''' end into the further on bit structures which would be connected thereto at the juncture of the bit structures. Thus, there is a narrowing of the width of bit structure 10''' ends from the width maintained in the central portion thereof under word line 20, but there is no discontinuity in connection with any reduction to zero width of magnetic film layers 16''' and 17'''. Rather than these ends following boundaries of intersecting lines, they meet and follow one of two different parallel lines prior to reaching such intersection. This configuration leads to an even smaller demagnetizing field effects than for the structures shown in FIGS. 2 and 3.

A typical narrowing for the FIG. 4 structure would be to have the end regions narrowed to approximately half the width of the central portion of bit structure 10''' under word line 20. Note that bit juncture interconnection 13 is still shown over the narrowed end portions and narrowed bridging portion continuing through the bit juncture area to the next bit structure to thereby provide an electrical short between adjacent bit structures. This is done to reduce the total resistance along a sequentially connected set of bit structures so that resistance changes during sensing relying on the magnetoresistance effect will yield a larger sensing signal. However, such juncture interconnections are not absolutely required at junctures of bit structures of the configuration shown in FIG. 4. Such bit structures can be designed to provide a usable sense signal in the absence of such juncture interconnections.

Experiment has verified that the number of fully operating bit structures in a digital memory arrangement is very significantly improved by the use of narrowed ends for bit structures of the present kind. Further, there is a decrease in current required along word lines for purpose of entering information into bit structures, the amount of current needed decreasing monotonically along the sequence of structure configurations shown from FIG. 1 through FIG. 5.

Figure 5:
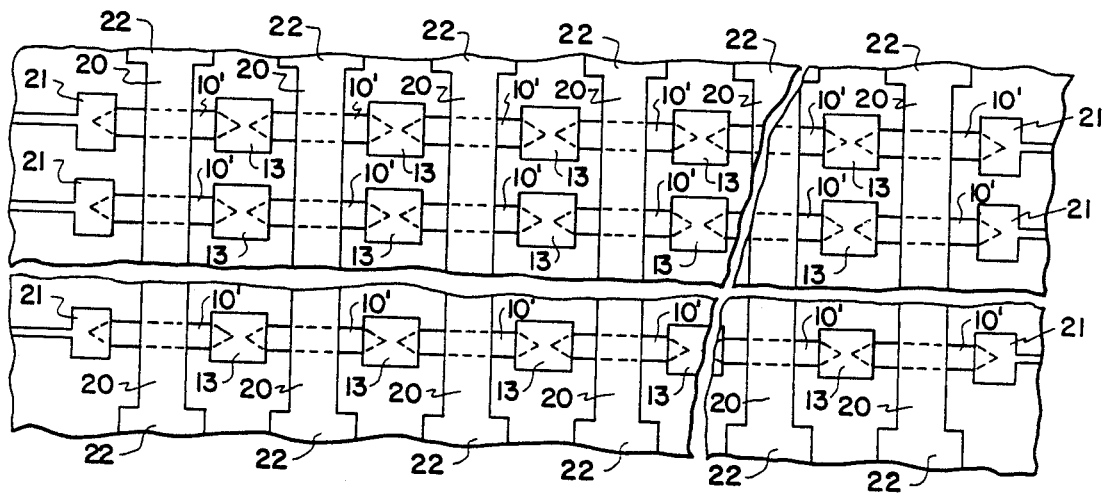
FIG. 5 shows a portion of an array of memory cells of the present invention each containing a memory film narrowed at ends near bit junctures.

A portion of an array of such bit structures as part of a digital memory is shown in FIG. 5 using the bit structure shown in FIG. 2. Each of bit structures 10' in a horizontal row is electrically joined to another in that row by interconnection junctures, 13. At opposite ends of each row there is provided end terminating regions, 21. Each row then represents a number of bit structures 10' electrically interconnected in series by junction interconnections 13 between end terminations 21 to thereby form a storage line structure.

FIG. 5 is shown with a vertical break to indicate that there may be a very large number of such bit structures in each row, a number much larger than shown. Similarly, FIG. 5 has a horizontal break to show there may be a much larger number of storage lines than has been shown in forming such a digital memory.

Also shown in FIG. 5 are a number of word lines, 20, one for each corresponding bit structure 10' in each storage line structure. Each word line 20 is an electrical conductor occurring in series between end terminations, 22. Each word line 20 is formed over portions of a corresponding bit structure 10' in each storage line structure and, although not specifically indicated in FIG. 5, has formed with an insulating layer (19) between word line 20 and adjacent portions of bit structure 10'. If insulating layer 19 of FIG. 2 was shown in FIG. 5, all lines but lines representing word lines 20 and end terminations 22 would be in dash form to show them being below such an insulating layer.

Also not shown is a further protective and insulating layer formed over the entire structure shown in FIG. 5. Showing such a layer would require all lines in FIG. 5 to be in dash form to indicate all structures shown there to be below such a protective layer.

Storage line end terminations 21 permit providing current through each storage line from one of end terminations 21 connected to that line to the other connected to the opposite end of that line. End terminations 21 are also electrically connected to other circuits such as sensing circuits, write control circuits, decoding circuits, or the like.

Similarly, word line terminations 22 permit current to be passed through word lines 20 from an end termination 20 at one end thereof to that end termination 20 provided at the other end. Word line end terminations 22 are also connected to other circuits such as current supply circuits, write control circuits, decoding circuits, or the like.

Junction interconnections 13, storage line end terminations 21, word lines 20, and word line end terminations 22 can all be formed of a convenient conductor material. Since the digital memory portion of FIG. 5 is intended to be provided on a surface portion of a monolithic integrated circuit so that circuits in other portions of the integrated circuit can be conveniently connected to end terminations 21 and 22, a typical conductor material used in integrated circuits would be appropriate. As stated in connection with FIG. 1 and carried over to FIG. 2, an aluminum layer containing a two percent alloy of copper on a titanium-tungsten base layer is satisfactory. The other materials for the structure in FIG. 5 have also been indicated in connection with FIGS. 1 and 2.

The embodiments of the invention in which an exclusive property or right is claimed are defined as follows:

1. A ferromagnetic thin film based digital memory, said memory comprising:
a first storage line structure having a first storage line pair of end terminals adapted to conduct electrical current in at least one direction, said storage line end terminals having electrically connected in series therebetween a plurality of bit structures with each bit structure electrically connected at a bit juncture to at least one other said bit structure, each said bit structure comprising an intermediate layer of a kind of separating material having two major surfaces on opposite sides thereof and a memory film on each of said intermediate layer major surfaces with said memory film being of a magnetoresistive, anisotropic magnetic material where said memory film is narrowed in extend near where said bit structure is electrically connected to a bit juncture, as aforesaid, with respect to its extent at centralized portions of said bit structure located farther from any said bit junctures, and a plurality of word line structures each having a pair of word line end terminals adapted to conduct electrical current in at least one direction, each of said pairs of word line end terminals having an electrical conductor electrically connected therebetween which is located across an electrical insulating layer from said memory film on one of said major surfaces of said intermediate layer at said centralized regions of a selected one of said bit structures.

2. The apparatus of claim 1 wherein a said bit juncture, at which one of said bit structures is electrically connected to another of said bit structures as aforesaid, has an electrically conducting interconnection material disposed at least in part on said narrowed magnetic film portions of each of said bit structures so connected.

3. The apparatus of claim 1 wherein a said bit juncture, at which one of said bit structures is electrically connected to another of said bit structures as aforesaid, provides such electrical connection with a spacing between said memory film of one said bit structures so connected and said memory film of that other bit structure so connected.

4. The apparatus of claim 1 wherein a said bit juncture, at which one of said bit structures is electrically connected to another of said bit structures as aforesaid, provides such electrical connection with said memory film of one said bit structure so connected continued through said bit juncture to be part of said memory film of that other said bit structure so connected.

5. The apparatus of claim 1 wherein said memory film is narrowed in extent substantially in conformance with boundaries substantially configured of two intersecting lines.

6. The apparatus of claim 1 wherein said memory film is narrowed in extent substantially in conformance with boundaries substantially configured of two intersecting lines which would intersect but which are terminated prior to such an intersection by each intersecting one of two different parallel lines.

7. The apparatus of claim 1 wherein an easy access of magnetization of said memory film in at least one of said bit structures is substantially perpendicular to an axis of said bit structure extending therethrough and intersecting said bit juncture.

8. The apparatus of claim 1 wherein said memory film on each of said major surfaces of said intermediate layer of at least one of said bit structures is arranged such that there are two separate films with one of said separate films on each of said major surfaces.

9. The apparatus of claim 2 wherein a said bit juncture, at which one of said bit structures is electrically connected to another of said bit structures as aforesaid, provides such electrical connection with a spacing between said memory film of one said bit structures so connected and said memory film of that other bit structure so connected.

10. The apparatus of claim 2 wherein a said bit juncture, at which one of said bit structures is electrically connected to another of said bit structures as aforesaid, provides such electrical connection with said memory film of one said bit structure so connected continued through said bit juncture to be part of said memory film of that other said bit structure so connected.

11. The apparatus of claim 3 wherein said memory film is narrowed in extent substantially in conformance with boundaries substantially configured of two intersecting lines.

12. The apparatus of claim 3 wherein said memory film is narrowed in extent substantially in conformance with boundaries substantially configured of two intersecting lines which would intersect but which are terminated prior to such an intersection by each intersecting one of two different parallel lines.

13. The apparatus of claim 4 wherein said memory film is narrowed in extent substantially in conformance with boundaries substantially configured of two intersecting lines.

14. The apparatus of claim 4 wherein said memory film is narrowed in extent substantially in conformance with boundaries substantially configured of two intersecting lines which would intersect but which are terminated prior to such an intersection by each intersecting one of two different parallel lines.

* * * * *